(12) United States Patent
Egoshi et al.

(10) Patent No.: US 6,237,176 B1
(45) Date of Patent: May 29, 2001

(54) SUBSTRATE OR SHEET SURFACE CLEANING APPARATUS

(75) Inventors: Kentaro Egoshi, Fuchu; Shouhei Mariyama, Tsukuba, both of (JP)

(73) Assignee: Rayon Industrial Co., Ltd., Fuchu (JP)

( * ) Notice: Subject to any disclaimer, the term of this patent is extended or adjusted under 35 U.S.C. 154(b) by 0 days.

(21) Appl. No.: 09/391,465

(22) Filed: Sep. 8, 1999

(30) Foreign Application Priority Data

Sep. 8, 1998 (JP) .................................................. 10-269071
Mar. 12, 1999 (JP) .................................................. 11-066672

(51) Int. Cl.[7] .................................................. B08B 11/00
(52) U.S. Cl. .................................................. 15/3; 15/102
(58) Field of Search .................................. 15/3, 100, 102, 15/104.002, 256.52

(56) References Cited

U.S. PATENT DOCUMENTS

| 3,914,817 | * | 10/1975 | Lindsay | 15/3 |
| 4,009,047 |   | 2/1977  | Lindsay | 134/9 |
| 4,982,469 | * | 1/1991  | Nishiwaki | 15/3 |
| 5,349,714 |   | 9/1994  | Korbonski et al. | 15/3 |
| 5,813,073 |   | 9/1998  | Korbonski | 15/3 |
| 5,913,345 | * | 6/1999  | Corrado et al. | 15/3 |

FOREIGN PATENT DOCUMENTS 0 214 741    3/1987   (EP) .

* cited by examiner

Primary Examiner—Mark Spisich
(74) Attorney, Agent, or Firm—Evenson, McKeown, Edwards & Lenahan, P.L.L.C.

(57) ABSTRACT

A substrate or sheet surface cleaning apparatus is provided with at least one tacky rubber roller and at least one adhesive tape roll which is brought into close contact with the tacky rubber roller. The roller and roll are rotatably supported at opposite ends of their shafts by bearings which are slidable in a vertical direction. Pressed rods are arranged integrally on the slidable bearings for the roll. By urging the pressed rods with pressing rods driven by d.c. motors via gear trains while controlling the d.c. motors by a position sensor, the pressure between the roll and the roller and the pressure between the roller and the substrate or sheet are optimized so that dirt or particles can be efficiently removed from an opposing surface of the substrate or sheet. Another substrate or sheet surface cleaning apparatus is provided two tacky rubber rollers arranged in an up-and-down parallel relationship and two adhesive tape rolls arranged above the upper roller and below the lower roller, respectively. Position adjusters with one or more springs disposed therein are arranged between slidable bearings supporting the upper roller and fixed bearings supporting the lower roller to correct tilting, if any, of the upper roller.

5 Claims, 12 Drawing Sheets

SUBSTRATE OR SHEET SURFACE CLEANING APPARATUS

BACKGROUND OF THE INVENTION a) Field of the Invention

This invention relates to a cleaning apparatus for removing dirt or particles from at least one surface of a substrate or sheet, on which the dirt or particles have deposited in a fabrication process thereof, by capturing the dirt or particles on a tacky rubber roller having tackiness and then transferring the dirt or particles onto an adhesive tape roll, and especially to a pressing control mechanism for the tacky rubber roller and adhesive tape roll, said pressing control mechanism being useful in the cleaning apparatus. This invention is also concerned with a substrate or sheet surface cleaning apparatus in which a tacky rubber roller can be assured to always remain at a surface thereof in close contact with a surface of substrate or sheet irrespective of the passing state, thickness or the like of the substrate or sheet.

b) Description of the Related Art

A substrate or sheet surface cleaning apparatus is provided with a tacky rubber roller having tackiness and an adhesive tape roll to remove dirt or particles from a surface of a substrate or sheet, on which the dirt or particles have deposited in a fabrication process thereof. It has been considered necessary to urge the adhesive tape roll against the tacky rubber roller and further to urge, under pressing force of the adhesive tape roll, the tacky rubber roller against the surface of the substrate or sheet such that the tacky rubber roller can be maintained in close contact under constant pressure with the surface of the substrate or sheet to facilitate the capture of the dirt or particles onto the tacky rubber roller and the dirt or particles captured on the tacky rubber roller can be surely transferred onto the adhesive tape roll. To control the pressing force from the adhesive tape roll, a pressing control mechanism is built in the cleaning apparatus. This pressing control mechanism generally makes use of air cylinders, each of which in turn uses as a power source compressed air supplied from an air compressor; solenoid-operated valves; torque motors; or the like.

Use of such air cylinders, however, requires pressure-reducing adjustments to obtain optimal pressures at the tacky rubber roller and adhesive tape roll employed in the cleaning apparatus, leading to a drawback that the operator is required to perform very irksome adjustments.

To supply compressed air as a power source for the air cylinders, it is necessary to install an air tank in addition to an air compressor. The space required for the installation of these air compressor and air tank reduces the working space, and moreover, their installation leads to an increase in the initial cost.

Further, such air cylinders tend to cause over-pressing due to their characteristic that cylinder rams are pushed to full extent by compressed air. As a consequence, there are significant potential problems in that a precise substrate such as LCD, from which dirt or particles deposited on a surface thereof is to be captured, transferred and removed when the precise substrate is caused to pass in close contact with the tacky rubber roller, may be damaged and the tacky rubber rollers themselves may also be damaged.

Use of the solenoid-operated valves, torque motors or the like, on the other hand, cannot carry out precise pressing control at elevated temperatures, because the performance of the solenoid-operated valves, torque motors or the like is reduced at such elevated temperatures. To avoid such a reduction in performance at elevated temperatures, a cooling system is additionally required for the solenoid-operated valves, torque motors or the like as the power source for the pressing control. In addition, precise control of pressing also requires precise control of power to be produced by these solenoid-operated valves, torque motors or the like. A complex electric power control circuit is therefore needed for obtaining a constant power output, leading to a still further drawback that the use of the solenoid-operated valves, torque motors of the like is very disadvantageous from the standpoint of the maintenance of the electric power control circuit and the running cost required for this maintenance.

A pressing control mechanism for tacky rubber rollers and adhesive tape rolls—which are used in a cleaning system in which dirt or particles deposited on opposite surfaces of the substrate or sheet during its fabrication process are captured by the tacky rubber rollers having tackiness and are then transferred and removed as described above—generally performs control over the entire tacky rubber rollers and adhesive tape rolls, in other words, performs control with the premise that pressing forces at opposite ends of the tacky rubber rollers and adhesive tape rolls become constant. If the substrate or sheet, i.e., the material under treatment passes between the tacky rubber rollers with its position extremely shifted either leftward or rightward relative to its advancing direction and especially when the substrate or sheet has a large thickness in the above situation, the tacky rubber rollers are caused to tilt by the passing substrate or sheet. As a result, the close contact of the tacky rubber rollers with the substrate or sheet may become uneven in the direction of axes of the tacky rubber rollers. Described specifically, each tacky rubber roller and the opposing surface of the substrate or sheet may therefore fail to come into close contact with each other and a space may be formed between them, although the tacky rubber roller should be brought into close contact under constant pressure with the opposing surface of the substrate or sheet. Accordingly, dirt or particles which deposited on the surface of the substrate or sheet in its fabrication process may not be fully removed.

The uneven close contact of the tacky rubber rollers with the substrate or sheet, which takes place as described above, lowers the surface treating ability of the tacky rubber rollers for the substrate or sheet and further, brings about another problem that, upon transferring and removing captured dirt or particles from the surfaces of the tacky rubber rollers onto the associated adhesive tape rolls by relying upon the close contact between the adhesive tape rolls and their corresponding tacky rubber rollers, the removal may not be effected fully.

With a view to avoiding such uneven close contact of the tacky rubber rollers against the substrate or sheet, it may be contemplated to arrange built-in pressing control mechanisms—each of which makes use of an air cylinder employing as a power source compressed air supplied from an air compressor, a solenoid-operated valve, a torque motor or the like—at opposite ends of the tacky rubber rollers and adhesive tape rolls and then to adjust pressures applied to the opposite ends of the tacky rubber rollers and adhesive tape rolls such that the surfaces of the tacky rubber rollers can be always maintained in fully close contact with the corresponding surfaces of the substrate or sheet. The arrangement of such built-in pressing control mechanisms, however, involves drawbacks such as a substantial increase in manufacturing cost, a reduction in working efficiency due to a need for irksome adjustments, and a significant disadvantage to maintenance work.

SUMMARY OF THE INVENTION

The present invention is intended to eliminate or lessen the above-described drawbacks of the conventional art. A first object of the present invention is to perform precise pressing control by a simple construction, thereby making it possible to improve the cleaning ability of a surface cleaning apparatus and also to provide the apparatus with fully enhanced durability. A second object of the present invention is to always assure close contact between a surface of a substrate or sheet, as a material under treatment, and a surface of a tacky rubber roller In one aspect of the present invention, there is thus provided a pressing control mechanism suitable for use in cleaning a surface of a substrate or sheet. The pressing control mechanism comprises:

a frame, a tacky rubber roller slidably supported at opposite ends thereof on the frame such that the tacky rubber roller can be operably brought into direct close contact with the surface of the substrate or sheet to capture dirt or particles from the surface of the substrate or sheet onto a surface of the tacky rubber roller, an adhesive tape roll supported at opposite ends thereof slidably in a vertical direction on the frame via slidable bearings such that the adhesive tape roll can be separably brought into close contact with the surface of the tacky rubber roller to capture and transfer the captured dirt or particles from the surface of the tacky rubber roller onto a surface of the adhesive tape roll, pressed rod supports arranged integrally with the slidable bearings, respectively, pressed rods supported on the pressed rod supports via compression springs, respectively, and pressing rods movable by rotation of corresponding motors transmitted via gear trains connected to motor shafts of the corresponding motors such that the pressing rods urge the pressed rods, respectively, wherein sliding of the adhesive tape roll toward or away from the tacky rubber roller makes it possible to increase or decrease a pressure between the adhesive tape roll and the tacky rubber roller, which are arranged at an interval therebetween in a beginning, and via the adhesive tape roll, a pressure between the tacky rubber roller and the substrate or sheet, which are arranged at an interval therebetween in the beginning, as desired.

In another aspect of the present invention, there is also provided a substrate or sheet surface cleaning apparatus, which comprises:

a frame, two tacky rubber rollers rotatably supported in a spaced up-and-down parallel relationship on the frame, at least one of the tacky rubber rollers being operably rotated by a feed motor to cause a substrate or sheet to pass through a space between the tacky rubber rollers while being brought into contact with the tacky rubber rollers, whereby dirt or particles adhered on opposite surfaces of the substrate or sheet passing through the space are captured and transferred, two adhesive tape rolls rotatably supported on the frame such that the adhesive tape rolls can be brought into close contact with the tacky rubber rollers to capture, transfer and remove the dirt or particles from the tacky rubber rollers, respectively, first slidable bearings arranged at opposite ends of at least one of the tacky rubber rollers such that the first slidable bearings are integral with the at least one tacky rubber roller and support the at least one tacky rubber roller slidably in a vertical direction, second slidable bearings arranged at opposite ends of a shaft of one of the adhesive tape rolls, said one adhesive tape roll corresponding to the at least one tacky rubber roller, such that the second slidable bearings are integral with the shaft of the corresponding adhesive tape roll and support the shaft of the corresponding adhesive tape roll slidable in a vertical direction to separably bring the corresponding adhesive tape roll into close contact with the at least one tacky rubber roller, pressed rod supports arranged integrally with the second slidable bearings, respectively, pressed rods supported on the pressed rod supports via compression springs, respectively, pressing rods arranged movably by rotation of corresponding pressure control motors transmitted via gear trains connected to motor shafts of the corresponding pressure control motors such that the pressing rods can urge the pressed rods, respectively, a position sensor arranged on one of the pressed rod supports, a sensed target arranged integrally with one of the pressed rods, said one pressed rod being arranged via its corresponding compression spring on one of the pressed rod supports, said one pressed rod support carrying the position sensor arranged thereon, and return mechanisms for automatically causing the at least one tacky rubber roller and its corresponding adhesive tape roll to return to positions, where the at least one tacky rubber roller and its corresponding adhesive tape roll are arranged at an interval therebetween in a beginning, when urging forces by the pressing rods are released, wherein, when the pressing rods urge their corresponding pressed rods, a difference between a stroke of the one pressed rod support occurred as a result of compression by its corresponding compression spring and a stroke of its corresponding pressed rod occurred as a result of the compression by the same compression spring is detected by the position sensor and the sensed target, and urging forces from the pressing rods to their corresponding pressed rods are controlled based on results of the detection such that the adhesive tape roll corresponding to the at least one tacky rubber roller is caused to slide to an optimal position via the respective pressed rod supports and their corresponding slidable bearings to increase or decrease a pressure between the at least one tacky rubber roller and its corresponding adhesive tape roll, which are arranged at the interval therebetween in the beginning, and via the corresponding adhesive tape roll, a pressure between the at least one tacky rubber roller and the surface of the substrate or sheet, which are arranged at an interval therebetween in the beginning, as desired.

In the above-described pressing control mechanism and cleaning apparatus according to the present invention, each of the pressed rods and its corresponding one of the pressing rods may be integrally connected together into a single rod.

When the pressing control mechanism arranged in the surface cleaning apparatus is operated to cause the pressing rods—which are reciprocated by the pressure control motors via the gear trains, respectively—to extend while performing a positional detection by the position sensor, the pressing rods come into contact with the corresponding pressed rods supported on the pressed rod supports integrally arranged on the second slidable bearings. As a consequence, the pressing rods urges the pressed rods, respectively. Where each of the pressed rods and its corresponding one of the pressing rods is integrally connected together into a single rod, the extension of the pressing rods directly results in the urging of the pressed rods. Accordingly, the second slidable bearings with the shafts of the adhesive tape rolls integrally supported thereon are urged toward their corresponding tacky rubber rollers. As a result of this urging, the adhesive tape rolls are urged toward the corresponding tacky rubber rollers and are brought into close contact with them, and further, the tacky rubber rollers are urged toward the opposing surfaces of the substrate or sheet and are brought into close contact with them. Pressures, which are applied from these two tacky rubber rollers to the opposing surfaces of the substrate or sheet passing between the tacky rubber rollers, are therefore increased. This makes it possible to efficiently capture, transfer and remove dirt or particles from the surfaces of the substrate or sheet passing between these two tacky rubber rollers. Moreover, the sliding of the shafts of the adhesive tape rolls toward their corresponding tacky rubber rollers increases the close-contacting forces of the adhesive tape rolls, resulting in close contact of the adhesive tape rolls with the tacky rubber rollers. This makes it possible to efficiently transfer dirt or particles, which have been captured on the tacky rubber rollers, onto the corresponding adhesive tape rolls, so that the surfaces of the tacky rubber rollers, said surfaces being brought into close contact with the substrate or sheet, are always kept clean.

As the pressing of the adhesive tape rolls is precisely effected by the pressing control mechanism making use of the pressure control motors, the pressing rods, the pressed rods and the like. This makes it possible to protect the tacky rubber rollers from deterioration which would otherwise occur due to over-pressing. In addition, these pressing forces are borne by the compression springs on which the pressed rods are supported, respectively. As a result, the protection of the tacky rubber rollers from deterioration is improved further, thereby making it possible to improve the durability of the tacky rubber rollers and also to avoid damages to the substrate or sheet itself.

In a still further aspect of the present invention, there is also provided a substrate or sheet surface cleaning apparatus, which comprises:

a frame, two tacky rubber rollers rotatably supported in a spaced up-and-down parallel relationship on the frame, at least one of the tacky rubber rollers being operably rotated by a feed motor to cause a substrate or sheet to pass through a space between the tacky rubber rollers while being brought into contact with the tacky rubber rollers, whereby dirt or particles adhered on opposite surfaces of the substrate or sheet passing through the space are captured and transferred, two adhesive tape rolls rotatably supported on the frame such that the adhesive tape rolls can be brought into close contact with the tacky rubber rollers to capture, transfer and remove the dirt or particles from the tacky rubber rollers, respectively, fixed bearings rotatably supporting the lower tacky rubber roller at opposite ends thereof on the frame, first slidable bearings rotatably supporting the upper tacky rubber roller at opposite ends thereof on the frame such that the upper tacky rubber roller is slidable in a vertical direction, second slidable bearings rotatably supporting the upper adhesive tape roll at opposite ends thereof on the frame such that the upper adhesive tape roll is slidable in the vertical direction, pressure control mechanisms for bringing the upper and lower tacky rubber rollers into close contact with their corresponding upper and lower adhesive tape rolls, respectively, a return mechanism for allowing the upper adhesive tape roll to separate from its corresponding upper tacky rubber roller, and position adjusters arranged between the first slidable bearings, which support the upper tacky rubber roller at the opposite ends thereof, and the fixed bearings, which support the lower tacky rubber roller at the opposite ends thereof, respectively, and said position adjusters being provided on lower sides thereof with flange portions fixed on the frame and on upper sides thereof with urging portions and also provided with at least one spring inserted between the flange portions and the urging portions, respectively, such that the springs are compressible in the vertical direction.

If the substrate or sheet passes between the tacky rubber rollers with its position extremely shifted either leftward or rightward relative to its advancing direction and especially when the substrate or sheet has a large thickness in the above situation, the upper tacky rubber roller is caused to tilt. As a result, a space is formed between the surface of the upper and the opposing surface of the substrate or sheet. Owing to the arrangement of the position adjusters as described above, the at least one spring inserted in the position adjuster located on a side opposite to the space is compressed by the tilting of the upper tacky rubber roller, and then expands back. The tilting of the upper tacky rubber rollers is therefore corrected so that the upper and lower tacky rubber rollers are maintained in parallel with each other. The tilting which occurred between the tacky rubber rollers is therefore eliminated. Close contact is therefore assured again between the surfaces of the tacky rubber rollers and the opposing surfaces of the substrate or sheet, thereby making it possible to surely remove dirt or particles from the surfaces of the substrate or sheet.

DETAILED DESCRIPTION OF THE INVENTION AND PREFERRED EMBODIMENTS

Figure 1:
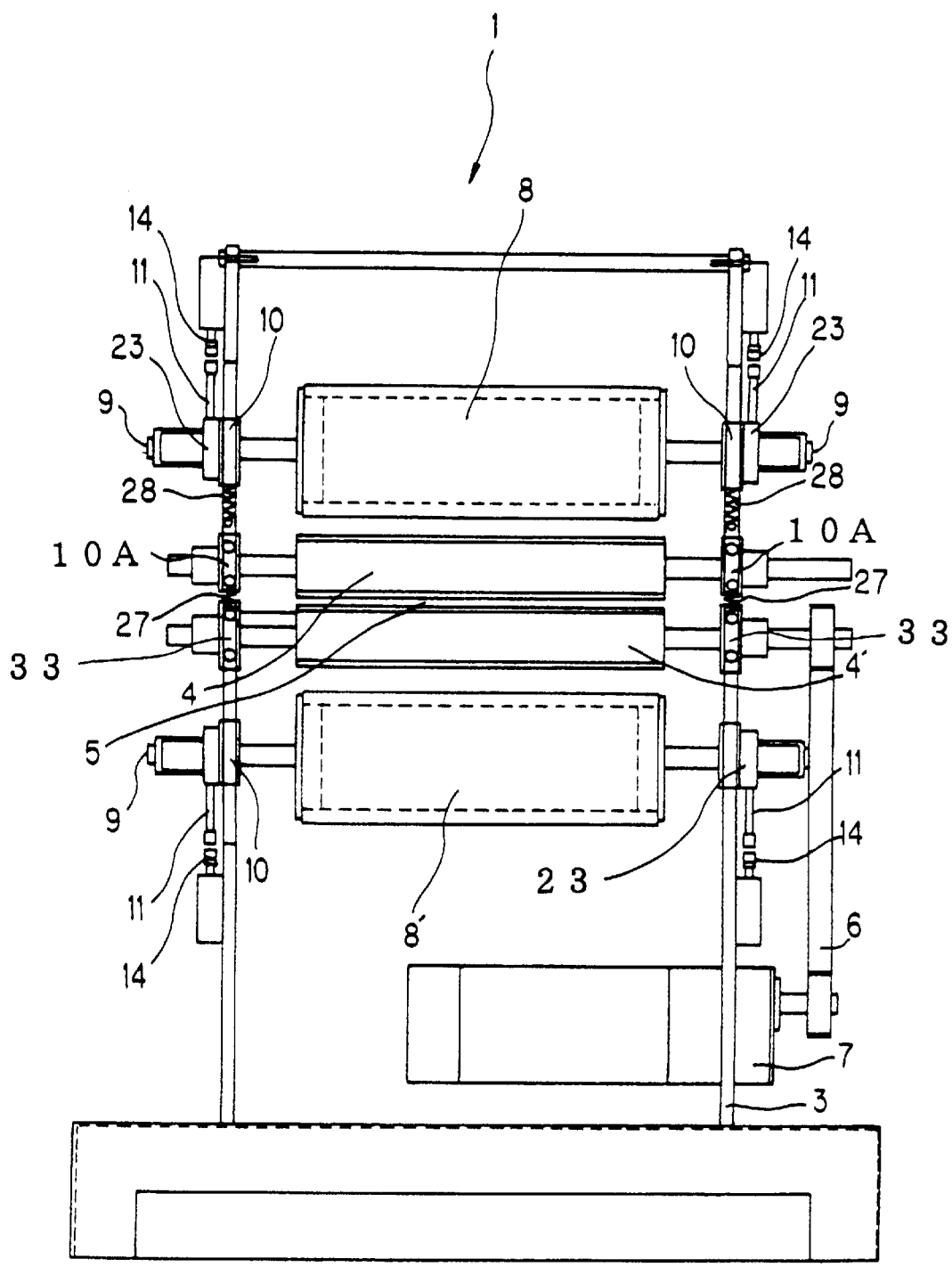
FIG. 1 is an overall schematic front view of a substrate or sheet surface cleaning apparatus according to a first embodiment of the present invention.

Referring first to FIG. 1 through FIG. 7, the substrate or sheet surface cleaning apparatus according to the first embodiment of the present invention will be described. In FIG. 1, numeral 1 indicates the substrate or sheet surface cleaning apparatus according to the first embodiment of the present invention. This substrate or sheet surface cleaning apparatus 1 is constructed of a frame 3, two tacky rubber rollers 4,4' and two adhesive tape rolls 8,8'. The tacky rubber rollers 4,4' are arranged in an up-and-down parallel relationship and are rotatably supported on the frame 3 such that dirt or particles deposited on surfaces of a substrate or sheet 2 (see FIG. 5), which passes through a space 5 between the tacky rubber rollers 4,4', can be captured, transferred and removed. One of the tacky rubber rollers 4,4', specifically the lower tacky rubber roller 4' is rotated by a motor 7 via a belt 6 to make it possible to feed the substrate or sheet 2 through the space 5 between the tacky rubber rollers 4,4'. On the other hand, the adhesive tape rolls 8,8' are rotatably supported such that they can be brought into or out of close contact with the corresponding tacky rubber rollers 4,4' as desired to further capture, transfer and remove dirt or particles from surfaces of the tacky rubber rollers 4,4'. Fresh adhesive tapes can be exposed by cutting off the used portions as needed.

Figure 2:
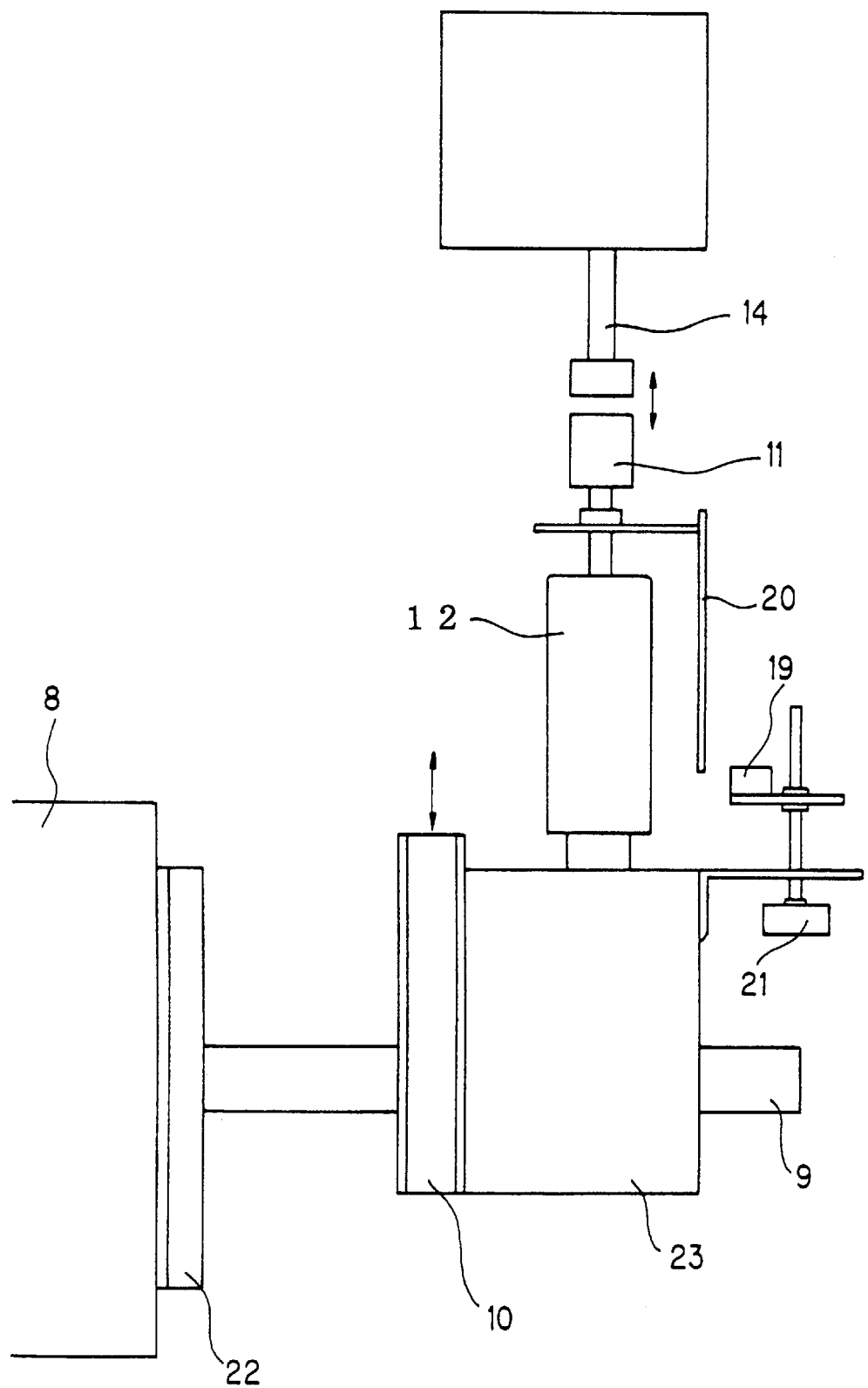
FIG. 2 is a fragmentary front view of the substrate or sheet surface cleaning apparatus according to the first embodiment of the present invention, showing a pressing control mechanism.
Figure 3:
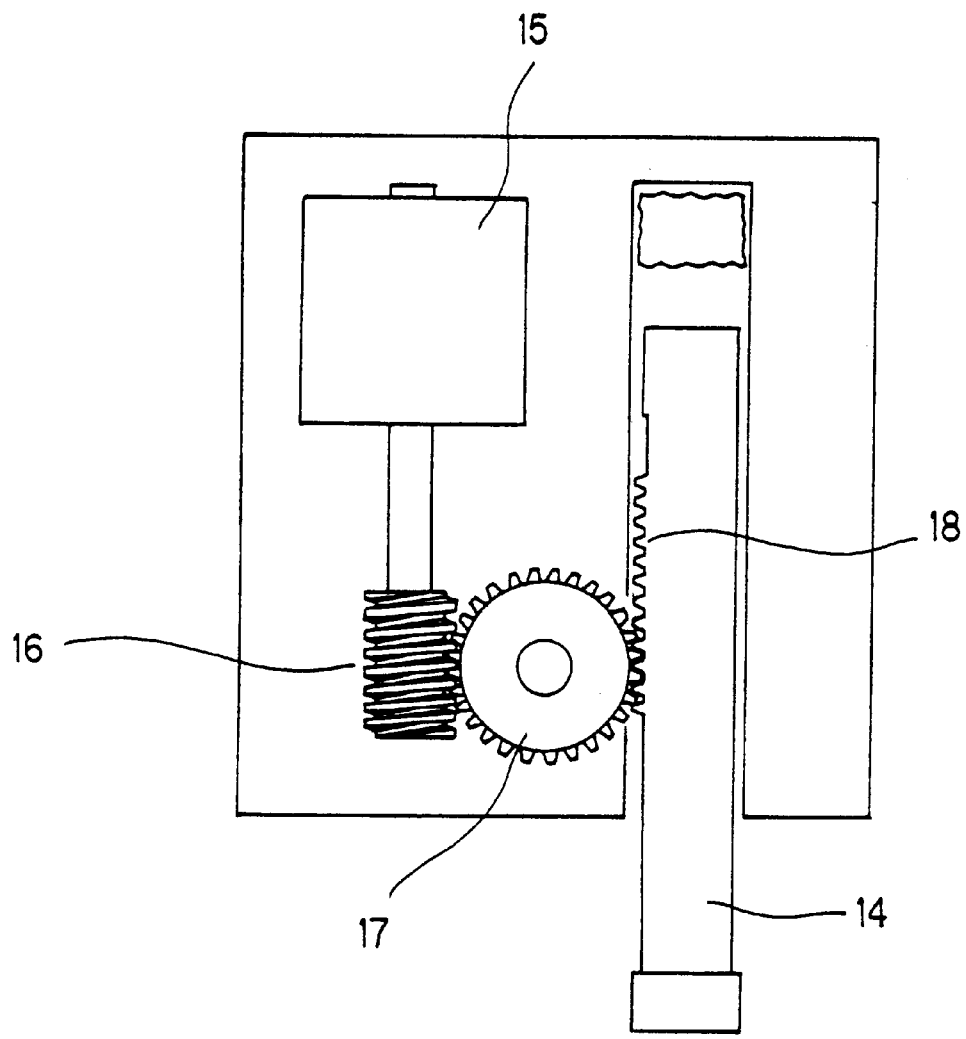
FIG. 3 is an enlarged fragmentary front view of the pressing control mechanism in the substrate or sheet surface cleaning apparatus according to the first embodiment of the present invention.
Figure 4:
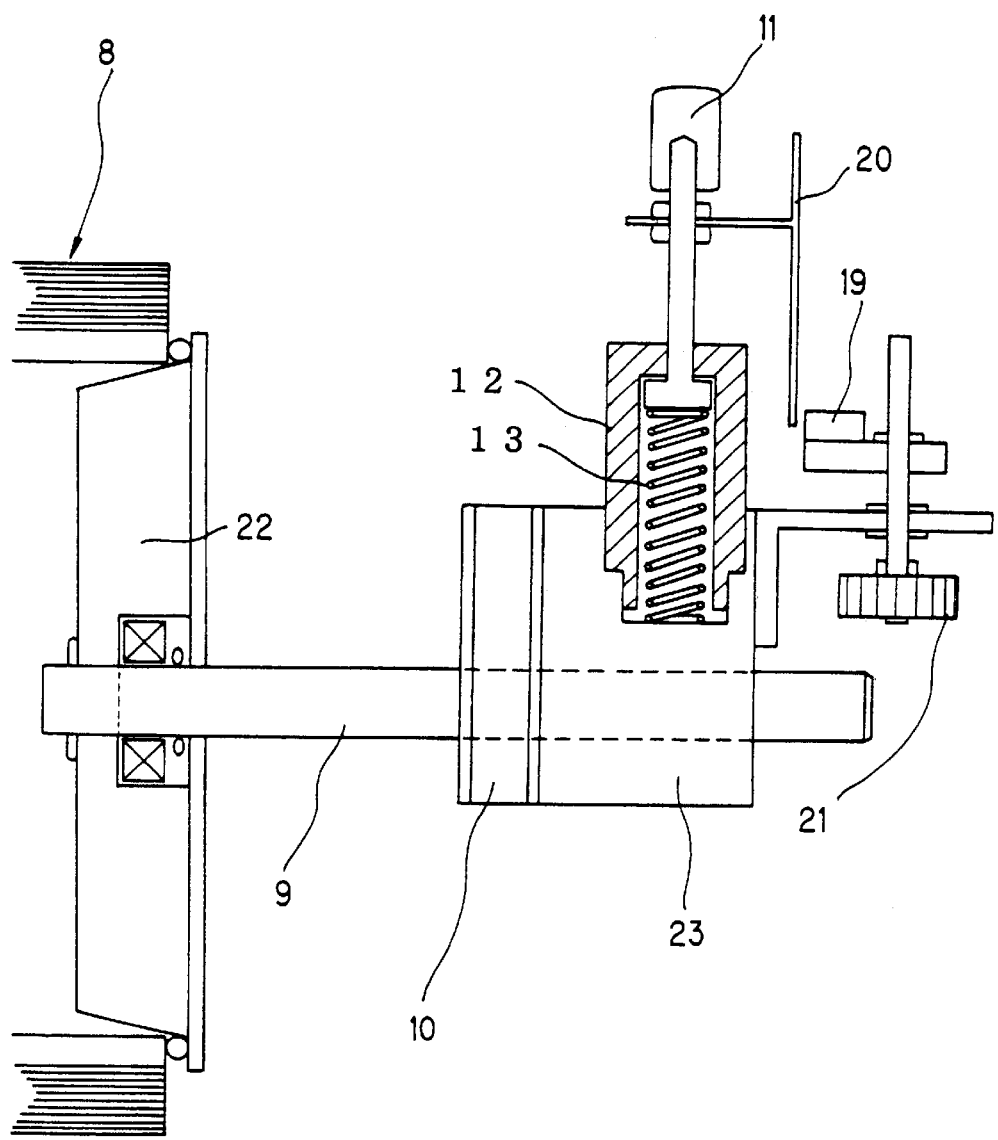
FIG. 4 is an enlarged fragmentary front view of the substrate or sheet surface cleaning apparatus according to the first embodiment of the present invention, illustrating the pressing control mechanism and a pressed rod.
Figure 5:
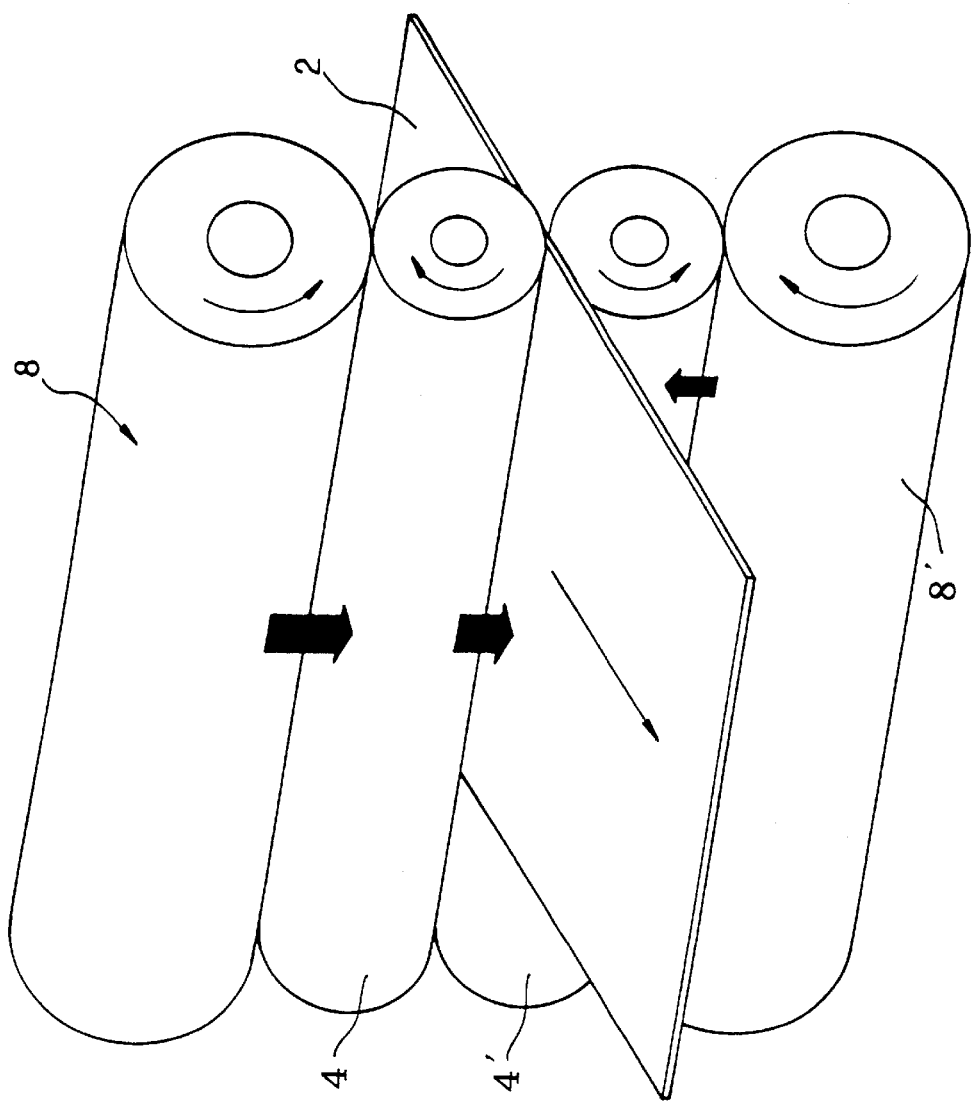
FIG. 5 is a schematic illustration showing transmission of a pressure from an adhesive tape roll to the substrate or sheet in the substrate or sheet surface cleaning apparatus according to the first embodiment of the present invention.

Of the above-described tacky rubber rollers 4,4', the lower tacky rubber roller 4' is not slidable in the vertical direction and is fixed by fixed bearings 33,33 at a level corresponding to the height of a conveyor (not shown) on and along which substrates or sheets 2 are conveyed. The upper tacky rubber roller 4, on the other hand, is supported at opposite ends thereof slidably in the vertical direction by slidable bearings 10A,10A so that they can be brought into or out of close contact with the lower tacky rubber roller 4' as desired. To apply spring force in a separating direction, tacky rubber roller springs 27 are arranged. Further, a shaft 9 of the upper adhesive tape roll 8 is integrally supported at opposite end thereof by slidable bearings 10,10, which are slidable in the vertical direction, such that the upper adhesive tape roll 8 can be brought into or out of close contact with the upper tacky rubber roller 4. As is illustrated in FIG. 2 through FIG. 4, these slidable bearings 10,10 are provided with pressing control mechanisms, respectively. Described specifically, a pressing rod 14 can be reciprocated by a rack 18 which is in meshing engagement via a planetary gear 17 with a worm gear 16 rotatable by a d.c. motor 15. A pressed rod 11 is arranged in opposition to the pressing rod 14 such that the pressing rod 11 can be brought into contact with the pressing rod 14. The pressed rod 11 is supported by a compression spring 13 which is accommodated within a pressed rod holder 12 arranged on a pressed rod support 23 which is in turn arranged integrally with the slidable bearing 10. While performing positional detection by a photoreflective sensor 19 as a position sensor, the slidable bearings 10,10 with the shafts 9 of the upper adhesive tape roll 8 integrally supported thereon are urged to slide by the pressing rods 14 via the pressed rods 11 and are then held at optimal positions, respectively.

The positional detection by the photoreflective sensor 19 is performed by determining how much of light emitted by the photoreflective sensor 19 has been reflected by a free end portion of a reflector plate 20 integrally secured on the pressed rod 11. This photoreflective sensor 19 is also provided with a position adjuster knob 21 to permit an adjustment of the initial position of the photoreflective sensor 19. It is to be noted that the position sensor is not limited to the photoreflective sensor 19. A touch sensor, a mechanical limit sensor or the like can also be used likewise.

With respect to the lower adhesive tape roll 8', on the other hand, pressing control mechanisms similar to those arranged for the upper adhesive tape rolls 8 are arranged upside down for the slidable bearings 10,10. Each of these adhesive tape rolls 8,8' is integrally supported on the corresponding slidable bearings 10,10 by fitting it at opposite ends thereof on adhesive tape holders 22,22 which are mounted on free end portions of the shafts 9,9 arranged integrally with the slidable bearings 10,10, respectively (see FIG. 4).

As the substrate or sheet surface cleaning apparatus 1 according to the first embodiment is provided with the above-described construction, the upper adhesive tape roll 8 is separated from the upper tacky rubber roller 4 in the beginning. When the upper pressing control mechanisms are actuated, the respective pressing rods 14,14 are brought into contact with the pressed rods 11, which are resiliently supported under expansion forces of the compression springs 13,13 in the corresponding pressed rod holders 12,12, and downwardly urge the pressed rods 11,11 while performing positional adjustment by means of the photoreflective sensor 19. As a result, the corresponding slidable bearings 10,10 precisely slide in the downward direction. Therefore, the upper adhesive tape roll 8 integrally supported on these slidable bearings 10,10 via the shafts 9,9 is brought into close contact with the upper tacky rubber roller 4 and downwardly urges the upper tacky rubber roller 4. The upper tacky rubber roller 4 supported on the slidable bearings 10A,10A is hence caused to slide downwardly further and is then brought into close contact with the lower tacky rubber roller 4'. If the substrate or sheet 2 as an object to be cleaned has a large thickness, it is only necessary to adjust the position adjuster knob 21 such that the upper tacky rubber roller 4 and the lower tacky rubber roller 4' maintain a suitable space therebetween without being brought into close contact with each other.

By downwardly urging the pressed rods 11,11 with the corresponding pressing rods 14,14, the upper adhesive tape roll 8 and the upper tacky rubber roller 4 with which the adhesive tape roll 8 is to be brought into close contact are caused to slide downwardly, whereby the space 5 between the two, that is, upper and lower tacky rubber rollers 4,4' is reduced or the upper and lower tacky rubber rollers 4,4' are brought into close contact with each other. This means that pressures from the tacky rubber rollers 4,4' to the surfaces of the substrate or sheet 2, which is passing between the upper and lower tacky rubber rollers 4,4' for the capture, transfer and removal of dirt or particles from the surfaces thereof, increase. It is therefore possible to efficiently capture, transfer and remove dirt or particles from the surfaces of the substrate or sheet 2 passing between these two tacky rubber rollers 4,4'. In addition, the downward sliding of the shaft 9 of the upper adhesive tape roll 8 of course results in close contact of the upper adhesive tape roll 8 with the upper tacky rubber roller 4 and also in urging of the upper tacky rubber roller 4 by the upper adhesive tape roll 8. Dirt or particles captured on the upper tacky rubber roller 4—which was directly brought into close contact with the opposing surface of the substrate or sheet 2 and captured, transferred and removed dirt or particles from the surface of the substrate or sheet 2—is also effectively captured and transferred to the upper adhesive tape roll 8, so that the surface of the upper tacky rubber roller 4 which is directly brought into contact with substrates or sheets 2 can always be kept clean, and the tackiness of the tacky rubber roller 4 can be retained over a long time.

At the lower adhesive tape roll 8', on the other hand, work similar to that performed at the upper adhesive tape roll 8 is carried out in a vertically reversed manner. Described specifically, the slidable bearings 10,10, on which the shafts 9,9 of the lower adhesive tape roll 81 are integrally supported, are caused to precisely slide in the upward direction by upwardly urging the corresponding pressed rods 11 with the associated pressing rods 14,14 while performing positional adjustment by a photoreflective sensor. Therefore, the lower adhesive tape roll 8' integrally supported on the slidable bearings 10,10 via the shafts 9,9, respectively, is upwardly urged and is brought into close contact with the lower tacky rubber roller 4'. As a consequence, the lower tacky rubber roller 4' is directly brought into close contact with the opposing surface of the substrate or sheet 2, and captures, transfers and remove dirt or particles from the opposing surface of the substrate or sheet 2. The dirt or particles are then captured efficiently from the lower tacky rubber roller 4' onto the lower adhesive tape roll 8'. The surface of the lower tacky rubber roller 4' which is directly brought into contact with substrates or sheets 2 can always be kept clean, and the tackiness of the tacky rubber roller 4' can be retained over a long time.

As the pressing of the upper adhesive tape roll 8 is precisely performed by the above-described pressing control mechanisms, the upper tacky rubber roller 4 which is directly brought into contact with substrates or sheets 2 is therefore protected from a deterioration which would otherwise occur as a result of excessive friction or close contact under over-pressing. A similar advantage can also be brought about for the lower tacky rubber roller 4'.

Further, each compression spring 13 is housed within the pressed rod holder 12 arranged on the pressed rod support 23 which is integral with the slidable bearing 10 with the shaft 9 of the upper adhesive tape roll 8 integrally supported thereon. When the pressing rod 14 is caused to extend downwardly as a result of rotation of the d.c. motor 15 and urges the corresponding pressed rod 11, the pressed rod 11 downwardly urges the pressed rod support 23 and further the slidable bearing 10 by way of the compression spring 13. The compression spring 13 is set in such a way that it is still not brought into a fully compressed state when the d.c. motor 15 has been stopped as a result of control by the photoreflective sensor 19 and reflector plate 20. When the substrate or sheet 2 passes between the upper and lower tacky rubber rollers 4,4' and upward urging force corresponding to the thickness of the substrate or sheet 2 is applied to the upper tacky rubber roller 4, this urging force can be absorbed by further compression of the compression spring 13 via the upper tacky rubber roller 4 and the upper adhesive tape roll 8. In other words, when the substrate or sheet 2 passes between the upper and lower tacky rubber rollers 4,4', the upper tacky rubber roller 4 and the upper adhesive tape roll 8 can slightly move in the upward direction corresponding to the thickness of the substrate or sheet 2. This makes it possible to further avoid deteriorations to the tacky rubber rollers 4,4' and hence to significantly improve their durability, to say nothing of prevention of damages to the substrate or sheet 2.

To cancel the urging of the tacky rubber rollers 4,4' by the adhesive tape rolls 8,8', the d.c. motors 15 are reversed, for example, to cause the pressing rods 14 for the upper adhesive tape roll 8 to return upward. The upper adhesive tape roll 8 then returns to a position, where the upper adhesive roll 8 is separated from the upper tacky rubber roller 4 under spring forces of adhesive tape roll springs 28. Further, the upper tacky rubber roller 4 is separated from the lower tacky rubber roller 4' under the spring force of the tacky rubber roller spring 27. The lower adhesive tape roll 8', on the other hand, separates by its own weight from the lower tacky rubber roller 4' when its urging by the pressing rods 14,14 is canceled.

Figure 6:
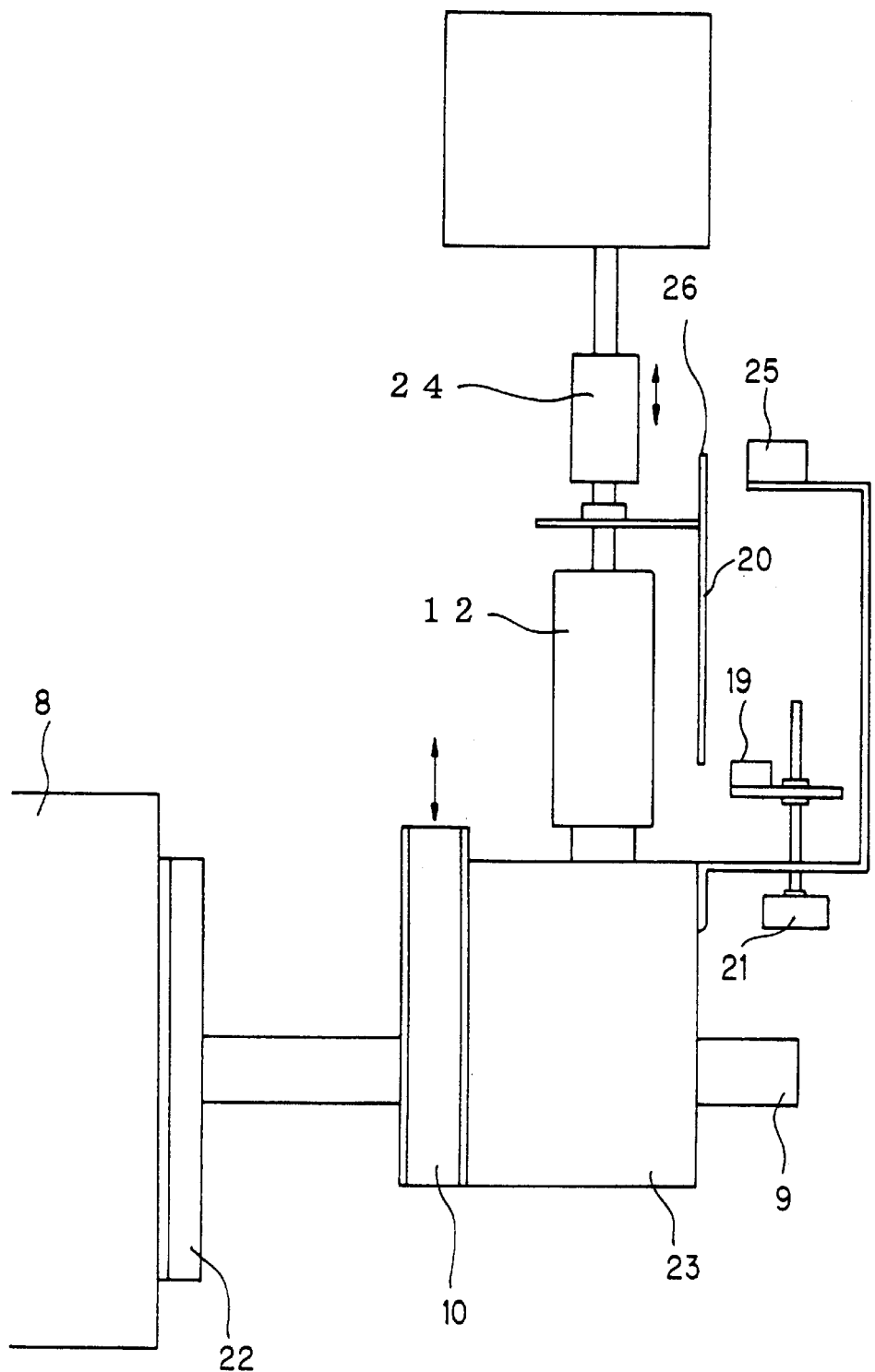
FIG. 6 is a fragmentary front view of a first modification of the pressing control mechanism in the substrate or sheet surface cleaning apparatus according to the first embodiment of the present invention.

With reference to FIG. 6, the first modification of the pressing control mechanism will be described. A rod 24, which has been formed by connecting the pressing rod 14 and the pressed rod 11 together into an integral member, is used. For the cancellation of biasing to the slidable bearing 10 for the upper adhesive tape roll 8, there are arranged a photoreflective upper limit photosensor 25 and an upper limit reflector plate 26 for the photoreflective upper limit photosensor 25. The photoreflective upper limit photosensor 25 serves to detect a limit at which the rod 24 should be pulled back upwardly. By pulling back the rod 24, the upper adhesive tape roll 8 is allowed to return to a position at which it is separated from the upper tacky rubber roll 4.

Figure 7:
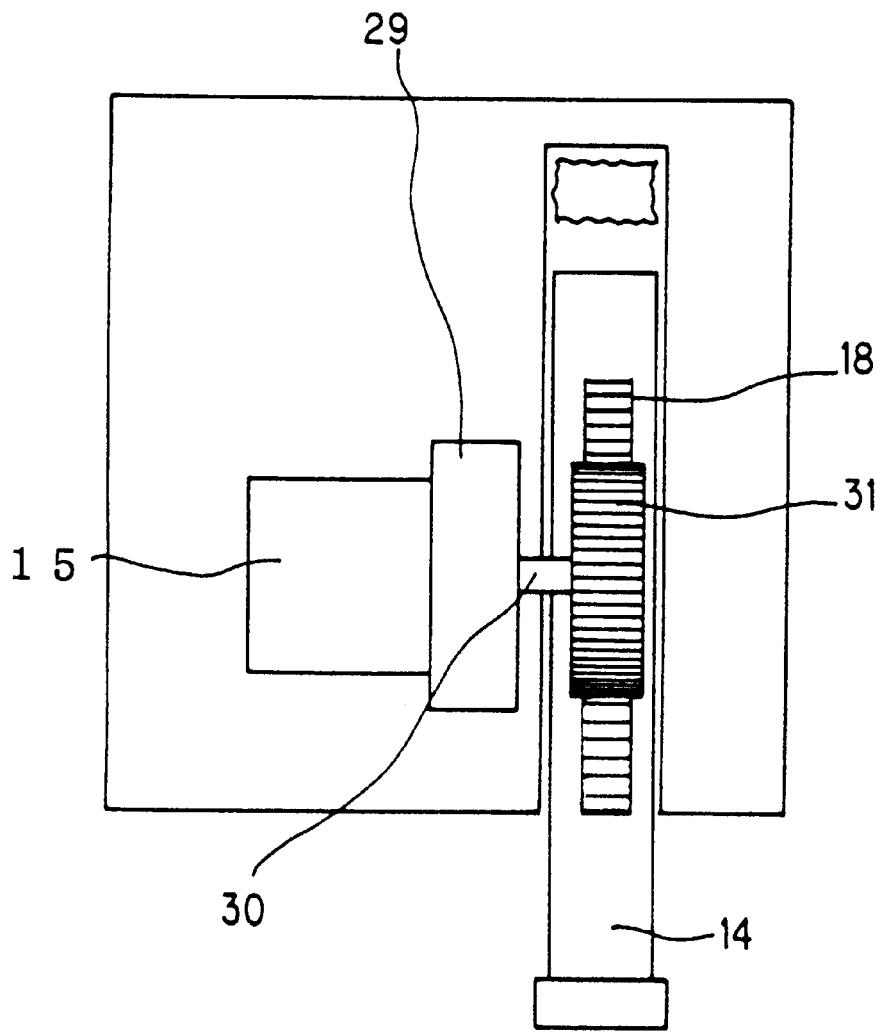
FIG. 7 is an enlarged fragmentary front view of a second modification of the substrate or sheet surface cleaning apparatus according to the first embodiment of the present invention.
Figure 8:
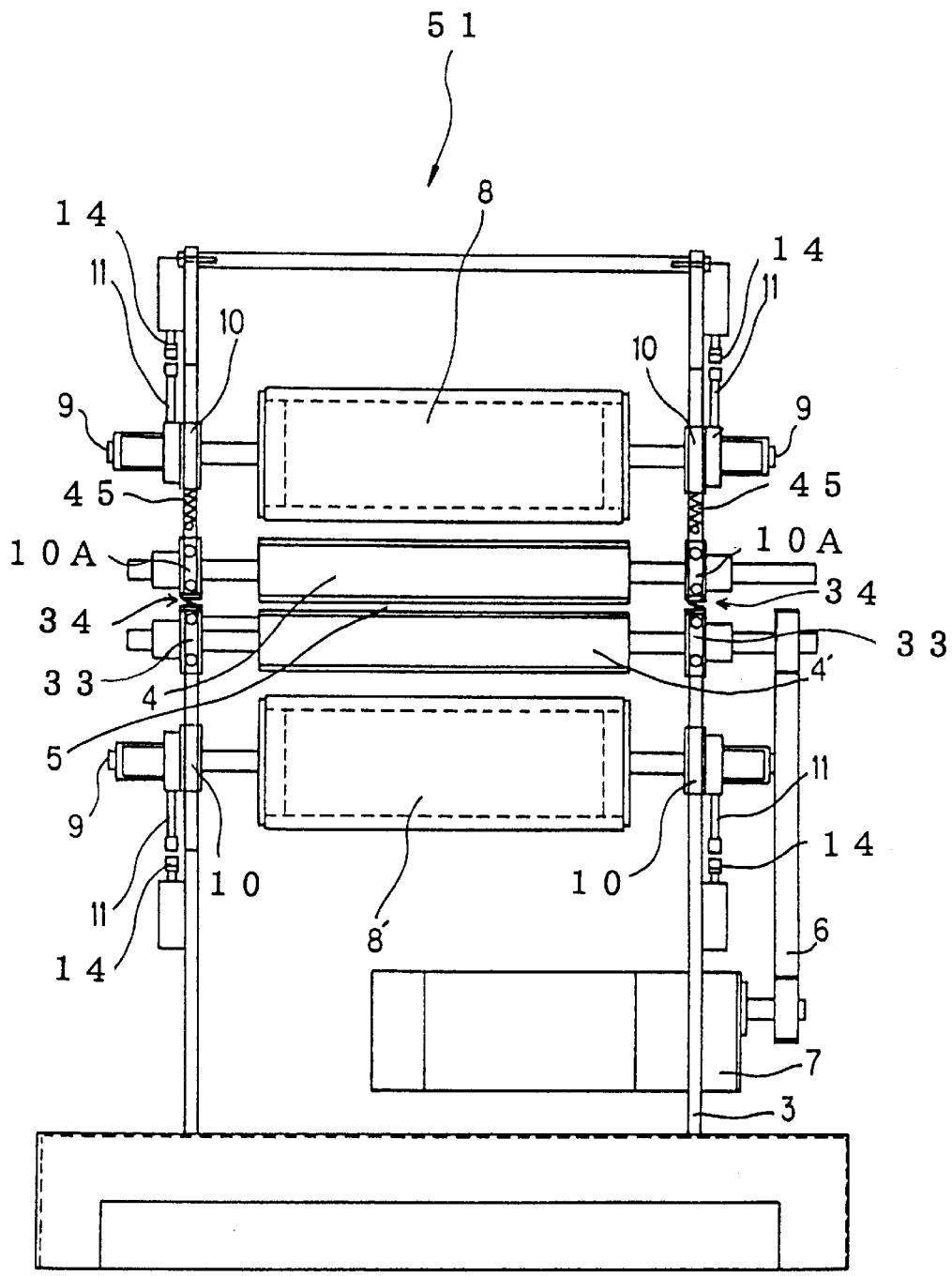
FIG. 8 is an overall schematic front view of a substrate or sheet surface cleaning apparatus according to a second embodiment of the present invention.
Figure 9:
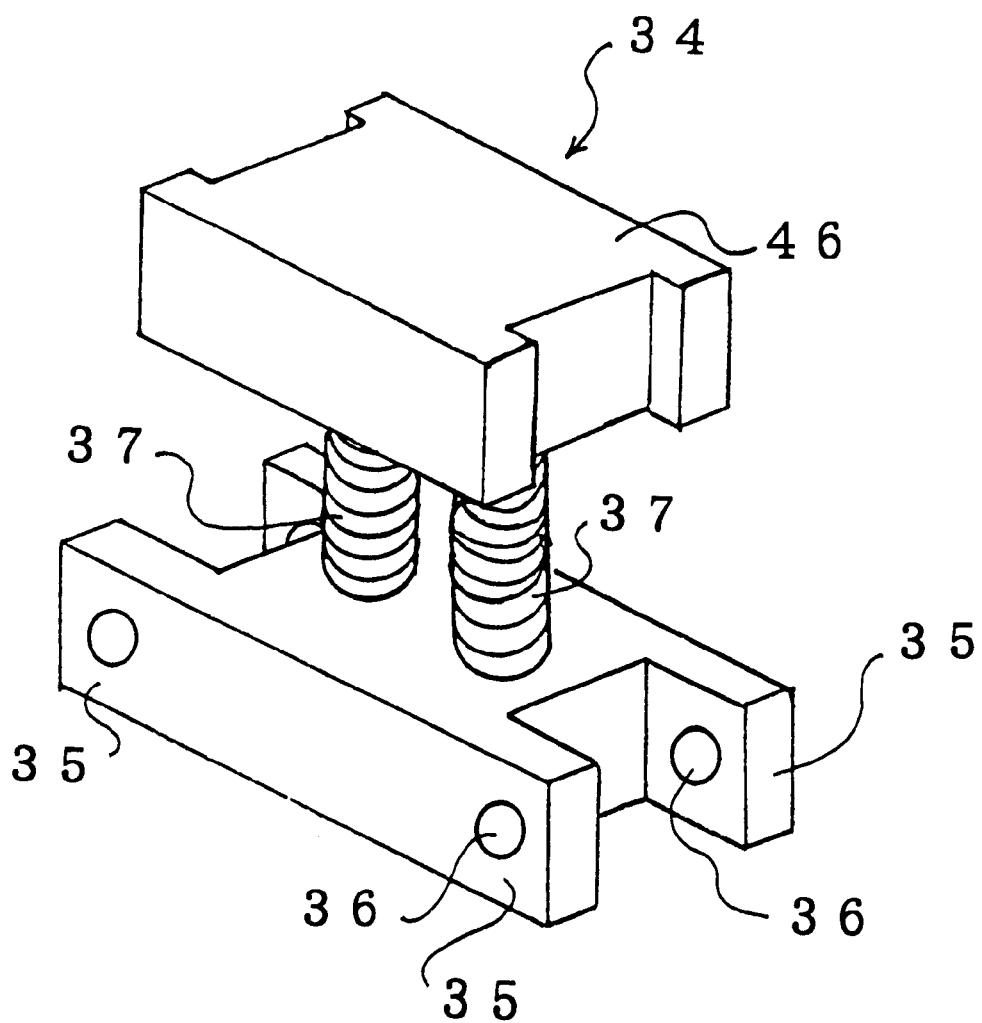
FIG. 9 is an overall perspective view of a position adjuster employed in the second embodiment of the present invention.
Figure 10:
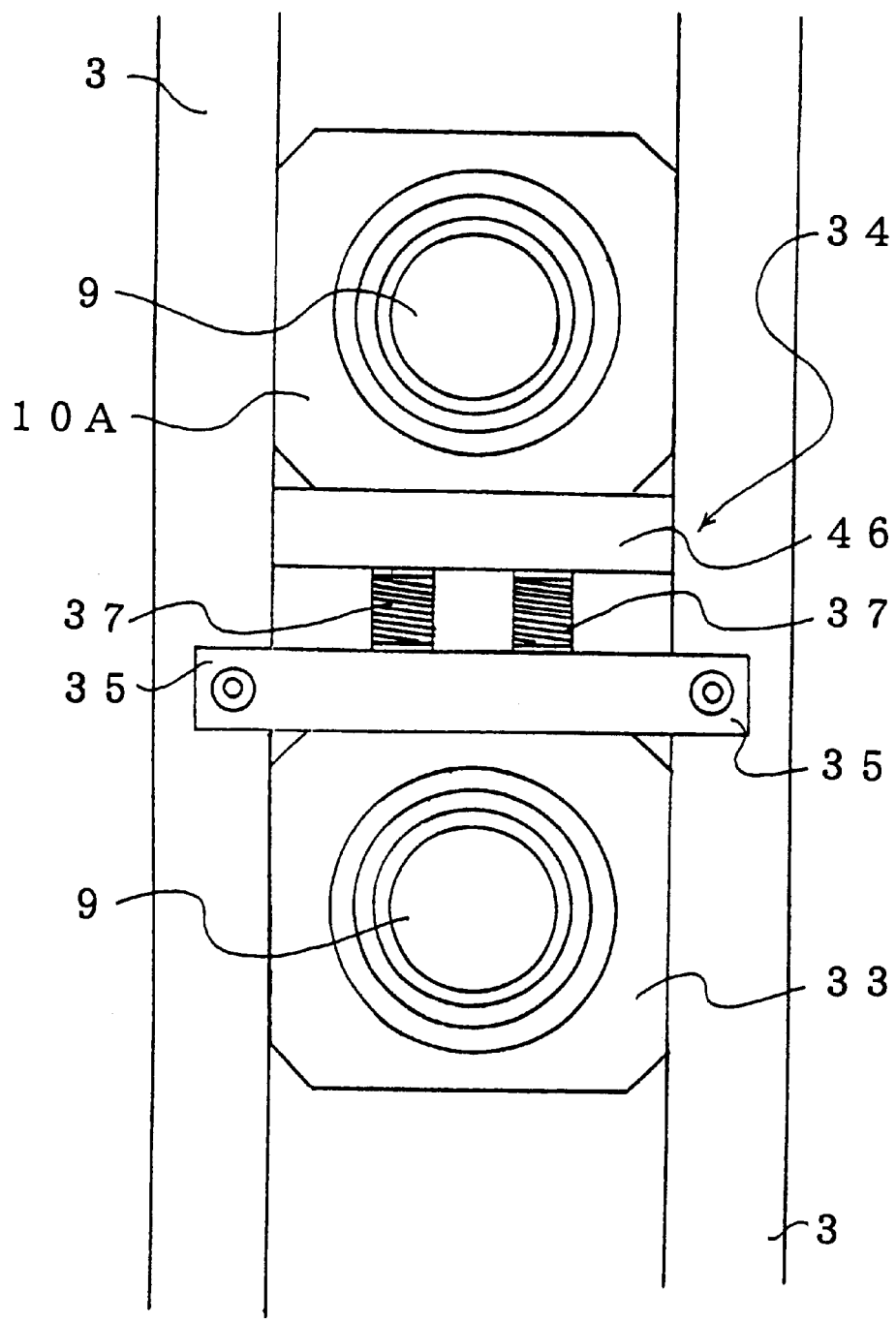
FIG. 10 is a fragmentary side view of the substrate or sheet surface cleaning apparatus according to the second embodiment of the present invention, illustrating the position adjuster assembled in the apparatus.

Referring to FIG. 7, the second modification of the pressing control mechanism will be described. A mechanism for reciprocating the pressing rod 14 can be constructed by mounting a speed-reducing gear head 29, the speed reduction ratio of which is in a range of from 1/100 to 1/200, on the motor shaft of the d.c. motor 15 and then arranging a gearwheel 31, which is fitted on a free end of a speed-reducing rotary shaft 30 extending from the speed-reducing gear head 29 in a direction away from the d.c. motor 15, in meshing engagement with the rack 18.

Reference will now be had to FIGS. 8 through 12, which illustrate the substrate or sheet surface cleaning apparatus according to the second embodiment of the present invention. In these drawings, element of structure either the same as or corresponding to those shown in FIGS. 1 through 8 are designated by like reference numerals, and a description of such elements is omitted herein. In the substrate or sheet surface cleaning apparatus 51 according to the second embodiment of the present invention, tacky rubber rollers 4,4' are supported in an up-and-down parallel relationship on slidable bearings 10A,10A and fixed bearings 33,33, respectively, on opposite sides of the apparatus 51 such that a substrate or sheet 2 as a material to be treated is allowed to pass through a space 5 between the tacky rubber rollers 4,4'. Between the slidable bearings 10A,10A and their corresponding fixed bearings 33,33, position adjusters 34,34 are arranged, respectively. Each position adjuster 34 has a base portion, an urging portion 46, and one or more vertically-compressible springs 37 arranged between the base portion and the urging portion 46. The base portion is provided with flange portions 35,35,35,35 through which mounting holes 36,36,36,36 are formed to fix the position adjuster 34 on the frame 3. The urging portion 46 has a size substantially equal to a bottom wall of the corresponding slidable bearing 10A for the upper tacky rubber roller 4.

Figure 12:
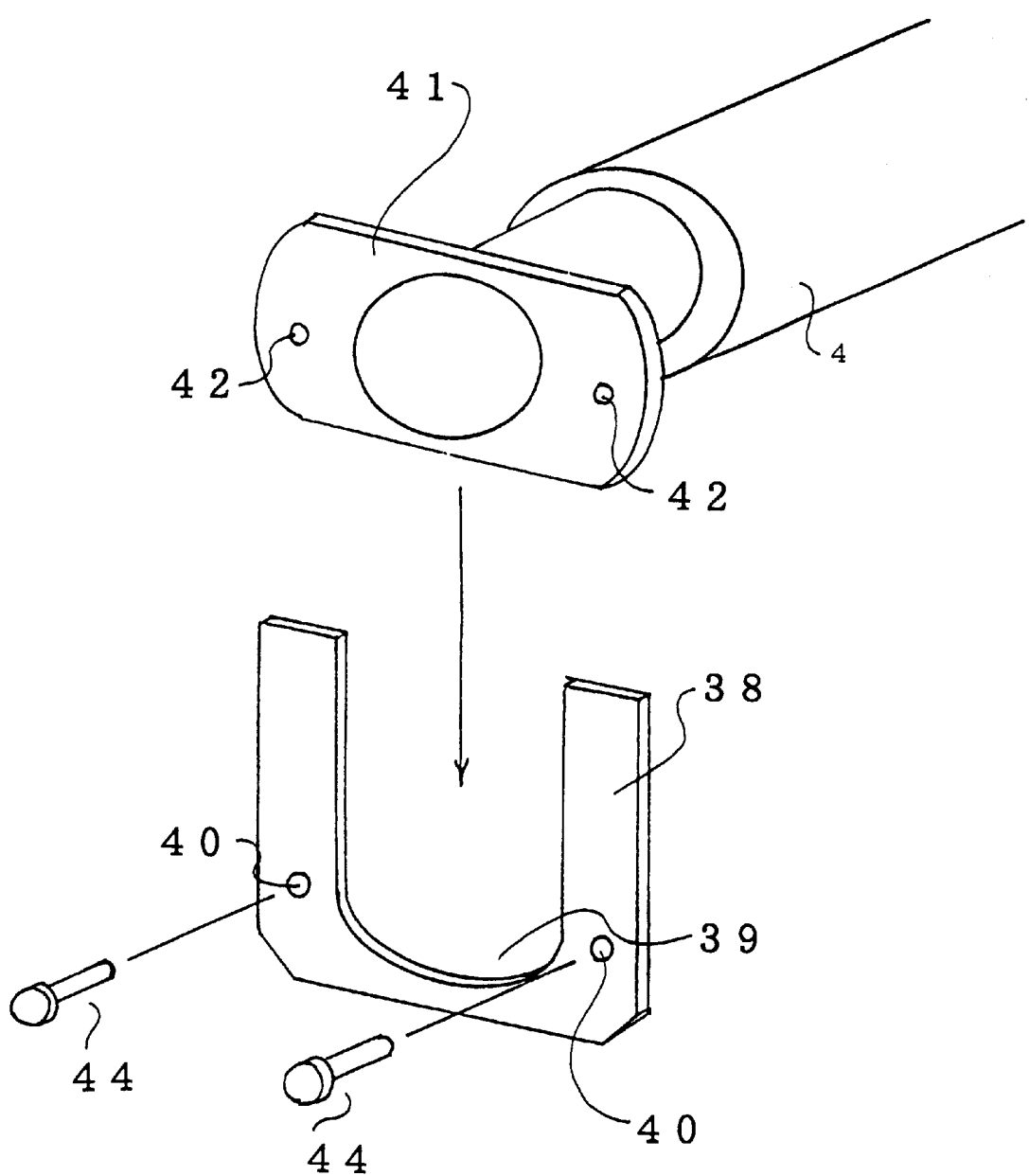
FIG. 12 is an exploded fragmentary perspective view of modifications of a tacky rubber roller and support structure therefor in the substrate or sheet surface cleaning apparatus according to the second embodiment of the present invention.

Reference is next had to FIG. 12. As the construction of each slidable bearing 10 or 10A or each fixed bearing 33 on which the tacky rubber roller 4 or 41 or adhesive tape roll 8 or 8' is mounted, a fixing flange 41 and a fixing flange bracket 38 may be used. The shaft of the tacky rubber roller 4 or 4' or the adhesive tape roll 8 or 8' is fixed on the fixing flange 41 via a bearing (not shown). The fixing flange bracket 38 is provided with a U-shaped shaft-holding edge 39 and fixing holes 40,40 formed on opposite sides of the U-shaped shaft-holding edge 39. These fixing holes 40,40 correspond to mounting holes 42,42 formed through the fixing flange 41. To fix the tacky rubber roller 4 or 4' or adhesive tape roll 8 or 8' on the fixing flange bracket 38 via the fixing flange 41, the shaft is inserted along the U-shaped shaft holding edge 39 until the mounting holes 42,42 are brought into registration with their corresponding fixing holes 40,40. Mounting bolts 44,44 are inserted through the mounting holes 42,42 and are then brought into threaded engagement with the fixing holes 40,40, respectively. To replace the tacky rubber roller 4 or 4' or adhesive tape roll 8 or 8' by a fresh tacky rubber roller or adhesive tape roll for the maintenance of the substrate or sheet surface cleaning apparatus 51, the tacky rubber roller 4 or 4' or adhesive tape roll 8 or 8' can be detached from the fixing flange bracket 38 by simply removing the mounting bolts 44,44 and then lifting the used tacky rubber roller 4 or 4' or adhesive tape roll 8 or 8' along the U-shaped, shaft-holding edge 39 of the fixing flange bracket 38. The fresh tacky rubber roller 4 or 4' or adhesive tape roll 8 or 8', on the other hand, can be precisely fixed at the predetermined position by causing the fresh tacky rubber roller 4 or 4' or adhesive tape roll 8 or 8', the shaft of which has been fixed on the fixing flange 41 via the bearing, to move downwardly along the U-shaped, shaft-holding edge 39 of the fixing flange bracket 38 and then threadedly securing the fixing flange 41 on the fixing flange bracket 38 with the mounting bolts 44,44. This replacement work can therefore be performed promptly with ease.

As the substrate or sheet surface cleaning apparatus 51 according to the second embodiment of the present invention is constructed as described above, the pressure to the substrate or sheet 2 as a material under treatment is maintained constant by the pressing control mechanisms arranged inside the cleaning apparatus 51. The substrate or sheet 2 with dirt or particles deposited on the surfaces thereof is therefore allowed to pass while being held under constant pressure between the tacky rubber rollers 4,4' the surfaces of which are always kept clean by their corresponding adhesive tape rolls 8,8', so that the dirt or particles are surely captured and removed onto the surfaces of the tacky rubber rollers 4,4'.

If the substrate or sheet 2 passes through the space 5 between the tacky rubber rollers 4,4' with its position extremely shifted either leftward or rightward relative to its advancing direction and especially when the substrate or sheet has a large thickness in the above situation, the upper tacky rubber rollers 4 out of the tacky rubber rollers 4,4' is caused to ascend at one of its opposite ends so that a gap 43 occurs between the tacky rubber roller 4 and the substrate or sheet 2. Further, there is another potential problem in that, when the adhesive tape roll 8 is brought into close contact with the surface of the tacky rubber roller 4 to remove dirt or particles from the surface of the tacky rubber roller 4, no uniform close contact may be achieved between the tacky rubber roller 4 and the adhesive tape roll 8. If these situations are left unsolved as they are, a problem may arise in that not only the removal of dirt or particles from the surface of the substrate or sheet 2 onto the tacky rubber roller 4 but also the removal of dirt or particles from the surface of the tacky rubber roller 4 onto the adhesive tape roll 8 may not be fully achieved.

Figure 11A:
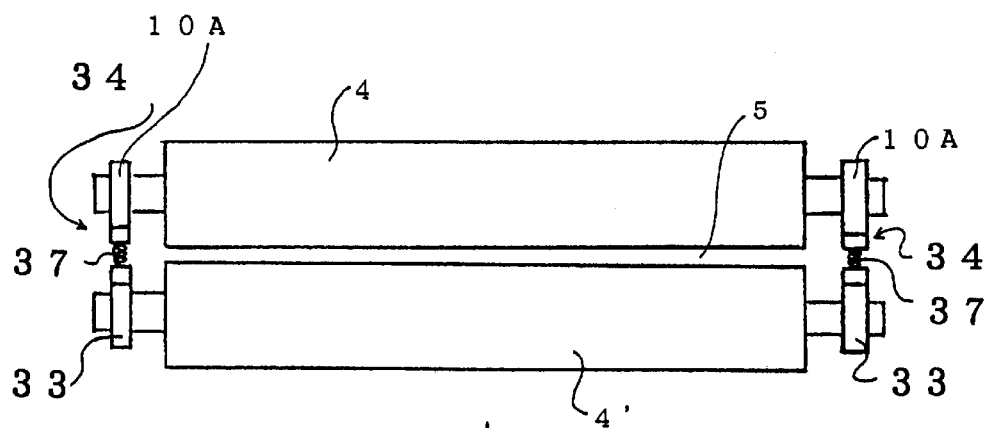
FIGS. 11A, 11B and 11C schematically illustrate the function of the position adjuster.
Figure 11B:
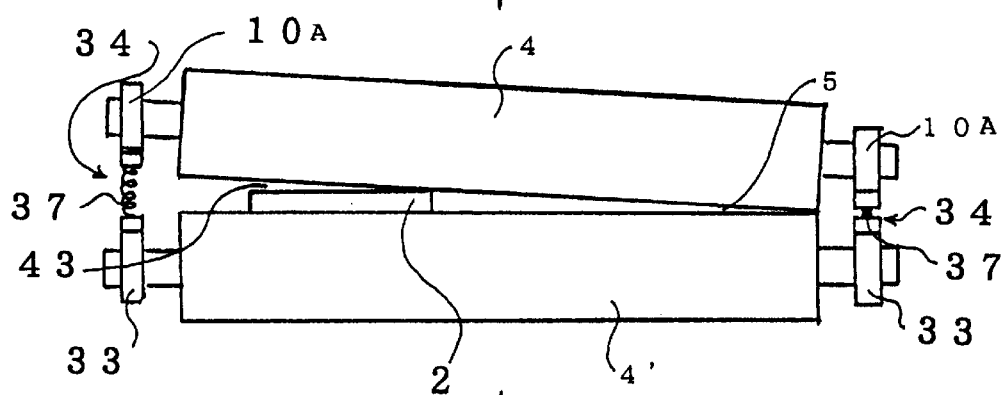
Figure 11C:
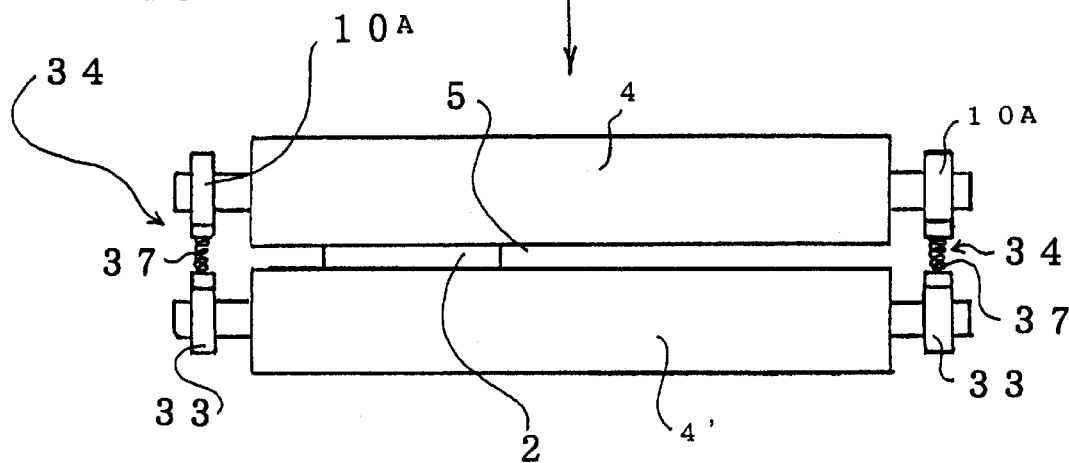

When such a thick substrate or sheet 2 passes between the tacky rubber rollers 4,4', the upper tacky rubber roller 4 to be brought into contact with the opposing surface of the substrate or sheet 2 may be caused to tilt although the upper tacky rubber 4 is supposed to remain in a substantially horizontal position as shown in FIG. 11A. This tilting then results in the occurrence of the gap 43 between the surface of the tacky rubber roller 4 and the opposing surface of the substrate or sheet 2. If this problem arises, the one or more springs 37 housed within one of the position adjusters 34,34, said one position adjuster 34 being located on a side opposite to the gap 43 occurred between the surface of the tacky rubber roller 4 and the opposing surface of the substrate or sheet 2, are first compressed by the tilting of the upper tacky rubber roller 4 and are then allowed to expand, as illustrated in FIG. 11B. Therefore, as is depicted in FIG. 11C, one of the slidable bearings 10A,10A for the upper tacky rubber roller 4, said one slidable bearing having moved to a lower position as a result of the tilting of the upper tacky rubber roller 4, is upwardly pushed by the urging portion 46 supported by the expanding spring or springs 37. The tilting of the upper tacky rubber roller 4 is therefore corrected to maintain the parallel relationship between the upper and lower tacky rubber rollers 4,4'. As a consequence, close contact is assured between the surface of the upper tacky rubber roller 4 and the opposing surface of the substrate or sheet 2, thereby making it possible to remove dirt or particles from the surface of the substrate or sheet 2 without failure. As the upper tacky rubber roller 4 itself is maintained in substantially a horizontal position owing to the arrangement of these position adjusters 34,34, the close contact of the adhesive tape roll 8 with the upper tacky rubber roller 4 is also maintained uniform so that the dirt or particles captured from the surface of the substrate or sheet 2 onto the upper tacky rubber roller 4 can be surely removed likewise.

When the pressing rods 14,14 for the upper adhesive tape roll 8 are caused to return upward and separate from the associated pressed rods 11,11, for example, by reversing their motors to cancel the urging of the upper tacky rubber roller 4 by the upper adhesive tape roll 8, the upper adhesive tape roll 8 returns to a position, where the upper adhesive tape roll 8 is separated from the upper tacky rubber roller 4, under the spring forces of the adhesive tape roll springs 45,45 arranged between frame 3 and the slidable bearings 10,10 for the upper adhesive tape roll 8. Further, the upper tacky rubber roller 4 is separated from the lower tacky rubber roller 4' under the spring forces of the springs 37,37 housed within the position adjusters 34,34. On the other hand, the lower adhesive tape roll 8' is separated by its own weight from the lower tacky rubber roller 4' when the urging of the pressed rods 11 by the associated pressing rods 14,14 is canceled likewise. The substrate or sheet surface cleaning apparatus 51 according to the second embodiment of the present invention is provided with the above-described return mechanisms.

This application claims the priority of Japanese Patent Application No. HEI 10-269071 filed Sep. 8, 1998 and that of Japanese Patent Application No. HEI 11-066672 filed Mar. 12, 1999, both of which are incorporated herein by reference.

What is claimed is:

1. A pressing control mechanism suitable for use in cleaning a surface of a substrate or sheet, comprising:
   a frame,
   a tacky rubber roller slidably supported at opposite ends thereof on said frame such that said tacky rubber roller can be operably brought into direct close contact with said surface of said substrate or sheet to capture dirt or particles from said surface of said substrate or sheet onto a surface of said tacky rubber roller,
   an adhesive tape roll supported at opposite ends thereof slidably in a vertical direction on said frame via slidable bearings such that said adhesive tape roll can be separably brought into close contact with said surface of said tacky rubber roller to capture and transfer said captured dirt or particles from said surface of said tacky rubber roller onto a surface of said adhesive tape roll,
   pressed rod supports arranged integrally with said slidable bearings, respectively,
   pressed rods supported on said pressed rod supports via compression springs, respectively, and
   pressing rods movable by rotation of corresponding motors transmitted via gear trains connected to motor shafts of said corresponding motors such that said pressing rods urge said pressed rods, respectively,
   wherein sliding of said adhesive tape roll toward or away from said tacky rubber roller makes it possible to increase or decrease a pressure between said adhesive tape roll and said tacky rubber roller, which are arranged at an interval therebetween in a beginning, and via said adhesive tape roll, a pressure between said tacky rubber roller and said substrate or sheet, which are arranged at an interval therebetween in the beginning, as desired.

2. A pressing control mechanism according to claim 1, wherein each of said pressed rods and its corresponding one of said pressing rods are integrally connected together into a single rod.

3. A substrate or sheet surface cleaning apparatus comprising;
   a frame,
   two tacky rubber rollers rotatably supported in a spaced up-and-down parallel relationship on said frame, at least one of said tacky rubber rollers being operably rotated by a feed motor to cause a substrate or sheet to pass through a space between said tacky rubber rollers while being brought into contact with said tacky rubber rollers, whereby dirt or particles adhered on opposite surfaces of said substrate or sheet passing through said space are captured and transferred,
   two adhesive tape rolls rotatably supported on said frame such that said adhesive tape rolls can be brought into close contact with said tacky rubber rollers to capture, transfer and remove said dirt or particles from said tacky rubber rollers, respectively,
   first slidable bearings arranged at opposite ends of at least one of said tacky rubber rollers such that said first slidable bearings are integral with said at least one tacky rubber roller and support said at least one tacky rubber roller slidably in a vertical direction,
   second slidable bearings arranged at opposite ends of a shaft of one of said adhesive tape rolls, said one adhesive tape roll corresponding to said at least one tacky rubber roller, such that said second slidable bearings are integral with said shaft of said corresponding adhesive tape roll and support said shaft of said corresponding adhesive tape roll slidable in a vertical direction to separably bring said corresponding adhesive tape roll into close contact with said at least one tacky rubber roller,
   pressed rod supports arranged integrally with said second slidable bearings, respectively,
   pressed rods supported on said pressed rod supports via compression springs, respectively,
   pressing rods arranged movably by rotation of corresponding pressure control motors transmitted via gear trains connected to motor shafts of said corresponding pressure control motors such that said pressing rods can urge said pressed rods, respectively,
   a position sensor arranged on one of said pressed rod supports,
   a sensed target arranged integrally with one of said pressed rods, said one pressed rod being arranged via its corresponding compression spring on one of said pressed rod supports, said one pressed rod support carrying said position sensor arranged thereon, and
   return mechanisms for automatically causing said at least one tacky rubber roller and its corresponding adhesive tape roll to return to positions, where said at least one tacky rubber roller and its corresponding adhesive tape roll are arranged at an interval therebetween in a beginning, when urging forces by said pressing rods are released,
   wherein, when said pressing rods urge their corresponding pressed rods, a difference between a stroke of said one pressed rod support occurred as a result of compression by its corresponding compression spring and a stroke of its corresponding pressed rod occurred as a result of said compression by the same compression spring is detected by said position sensor and said sensed target, and urging forces from said pressing rods to their corresponding pressed rods are controlled based on results of said detection such that said adhesive tape roll corresponding to said at least one tacky rubber roller is caused to slide to an optimal position via said respective pressed rod supports and their corresponding slidable bearings to increase or decrease a pressure between said at least one tacky rubber roller and its corresponding adhesive tape roll, which are arranged at said interval therebetween in the beginning, and via said corresponding adhesive tape roll, a pressure between said at least one tacky rubber roller and said surface of said substrate or sheet, which are arranged at an interval therebetween in the beginning, as desired.

4. A pressing control mechanism according to claim 3, wherein each of said pressed rods and its corresponding one of said pressing rods are integrally connected together into a single rod.

5. A substrate or sheet surface cleaning apparatus comprising:
   a frame,
   two tacky rubber rollers rotatably supported in a spaced up-and-down parallel relationship on said frame, at least one of said tacky rubber rollers being operably rotated by a feed motor to cause a substrate or sheet to pass through a space between said tacky rubber rollers while being brought into contact with said tacky rubber rollers, whereby dirt or particles adhered on opposite surfaces of said substrate or sheet passing through said space are captured and transferred, two adhesive tape rolls rotatably supported on said frame such that said adhesive tape rolls can be brought into close contact with said tacky rubber rollers to capture, transfer and remove said dirt or particles from said tacky rubber rollers, respectively, fixed bearings rotatably supporting said lower tacky rubber roller at opposite ends thereof on said frame, first slidable bearings rotatably supporting said upper tacky rubber roller at opposite ends thereof on said frame such that said upper tacky rubber roller is slidable in a vertical direction, second slidable bearings rotatably supporting said upper adhesive tape roll at opposite ends thereof on said frame such that said upper adhesive tape roll is slidable in said vertical direction, pressure control mechanisms for bringing said upper and lower tacky rubber rollers into close contact with their corresponding upper and lower adhesive tape rolls, respectively, a return mechanism for allowing said upper adhesive tape roll to separate from its corresponding upper tacky rubber roller, and position adjusters arranged between said first slidable bearings, which support said upper tacky rubber roller at said opposite ends thereof, and said fixed bearings, which support said lower tacky rubber roller at said opposite ends thereof, respectively, and said position adjusters being provided on lower sides thereof with flange portions fixed on said frame and on upper sides thereof with urging portions and also provided with at least one spring inserted between said flange portions and said urging portions, respectively, such that said springs are compressible in said vertical direction.

* * * * *